US011725650B2

(12) United States Patent
Kitamura et al.

(10) Patent No.: US 11,725,650 B2
(45) Date of Patent: Aug. 15, 2023

(54) LIQUID FEEDER

(71) Applicant: Nidec Corporation, Kyoto (JP)

(72) Inventors: Yoshihisa Kitamura, Kyoto (JP); Takaya Okuno, Kyoto (JP); Toshihiko Tokeshi, Kyoto (JP); Takehito Tamaoka, Kyoto (JP); Akihiko Makita, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 211 days.

(21) Appl. No.: 17/358,071

(22) Filed: Jun. 25, 2021

(65) Prior Publication Data

US 2022/0057124 A1 Feb. 24, 2022

(30) Foreign Application Priority Data

Aug. 21, 2020 (JP) ................. 2020-140481

(51) Int. Cl.
| | | |
|---|---|---|
| *F04B 53/16* | (2006.01) | |
| *F04B 53/10* | (2006.01) | |
| *F16L 37/32* | (2006.01) | |
| *F04B 53/22* | (2006.01) | |

(52) U.S. Cl.
CPC ............. *F04B 53/16* (2013.01); *F04B 53/10* (2013.01); *F04B 53/22* (2013.01); *F16L 37/32* (2013.01)

(58) Field of Classification Search
CPC .......... F04B 17/00; F04B 17/03; F04B 53/10; F04B 53/16; F04B 53/162; F04B 53/22; F04D 13/06; F04D 13/12; F04D 13/14; F04D 29/007; F04D 29/60; F04D 29/605; F04D 29/62; F04D 29/628; F04D 29/40; F04D 29/406; F04D 29/42; F04D 29/426; F04D 29/4293; F04D 29/58; F04D 29/586; F04D 29/5866; F04D 29/5873; F16L 37/32

See application file for complete search history.

(56) References Cited

U.S. PATENT DOCUMENTS

| | | | |
|---|---|---|---|
| 4,953,592 A * | 9/1990 | Takahashi | F16L 37/32 137/614.04 |
| 9,693,486 B1 | 6/2017 | Iwasaki | |
| 10,939,590 B2 | 3/2021 | Bonnin et al. | |
| 2009/0051161 A1 * | 2/2009 | Ekstrom | F16L 37/32 285/29 |
| 2014/0251124 A1 * | 9/2014 | Tazioli | F04D 1/06 92/161 |

FOREIGN PATENT DOCUMENTS

JP 2016-218716 A 12/2016

\* cited by examiner

*Primary Examiner* — Charles G Freay
*Assistant Examiner* — Chirag Jariwala
(74) *Attorney, Agent, or Firm* — Keating & Bennett

(57) ABSTRACT

A liquid feeder switches a flow path of a liquid having flowed in from an inflow port to one of a flow path communicating with a first base communication port and a bypass outflow path. When a pump is attached to a base, the bypass outflow path is closed to allow the liquid having flowed in from the inflow port to flow to the pump. When the pump is removed from the base, the bypass outflow path is opened to allow the liquid having flowed in from the inflow port to flow from the bypass outflow path to the outflow port. The liquid feeder is able to prevent liquid leakage when a pump of a liquid feeder is replaced or repaired.

6 Claims, 13 Drawing Sheets

LIQUID FEEDER

CROSS REFERENCE TO RELATED APPLICATION

The present application claims priority under 35 U.S.C. § 119 to Japanese Patent Application No. 2020-140481 filed on Aug. 21, 2020, the entire contents of which are hereby incorporated herein by reference.

1. FIELD OF THE INVENTION

The present invention relates to a liquid feeder.

2. BACKGROUND

A liquid feeder that feeds liquid using a pump is used in various apparatuses. For example, the liquid feeder is used in a cooling apparatus that circulates a refrigerant for cooling a heat source. When a cooling module is used for cooling a server or the like, the server typically operates for a long time, and thus the cooling module also needs to operate for a long time. For this reason, improvement in robustness when the cooling module fails has been studied.

Conventional server cabinets are configured such that multiple servers each can be cooled by multiple liquid cooling modules. Thus, the conventional server cabinets are configured such that even when a certain liquid cooling module fails, another liquid cooling module operates. This enables the multiple servers to continuously operate without a stop.

Unfortunately, the conventional server cabinets require replacing a pump to prevent a liquid in a liquid module from leaking.

SUMMARY

A liquid feeder according to an example embodiment of the present disclosure includes a pump, and a base that is detachable from the pump and through which a liquid flows between the base and the pump when attached to the pump. The base includes a base flow path portion and a base seal. The base flow path portion includes an inflow port into which a liquid flows, an outflow port from which the liquid flows out, a first base communication port that is detachable from the pump and through which the liquid having flowed in from the inflow port flows to the pump at the time of connection to the pump, a second base communication port that is detachable from the pump and through which the liquid fed from the pump flows at the time of the connection to the pump, a base inflow path that allows the inflow port to communicate with the first base communication port, a base outflow path that allows the second base communication port to communicate with the outflow port, and a bypass outflow path that is provided in the middle of the base inflow path and communicates with the outflow port. The base sealing includes a first base seal that seals the first base communication port when the pump is removed from the base and opens the first base communication port when the pump is attached to the base, and a second base seal that seals the second base communication port when the pump is removed from the base and opens the second base communication port when the pump is attached to the base. The liquid feeder switches a flow path of the liquid having flowed in from the inflow port to one of a flow path communicating with the first base communication port and the bypass outflow path. The liquid feeder closes the bypass outflow path to cause the liquid having flowed in from the inflow port to flow to the pump when the pump is attached to the base, and opens the bypass outflow path to cause the liquid having flowed in from the inflow port to flow from the bypass outflow path to the outflow port when the pump is removed from the base.

The above and other elements, features, steps, characteristics and advantages of the present disclosure will become more apparent from the following detailed description of the example embodiments with reference to the attached drawings.

DETAILED DESCRIPTION

Figure 1:
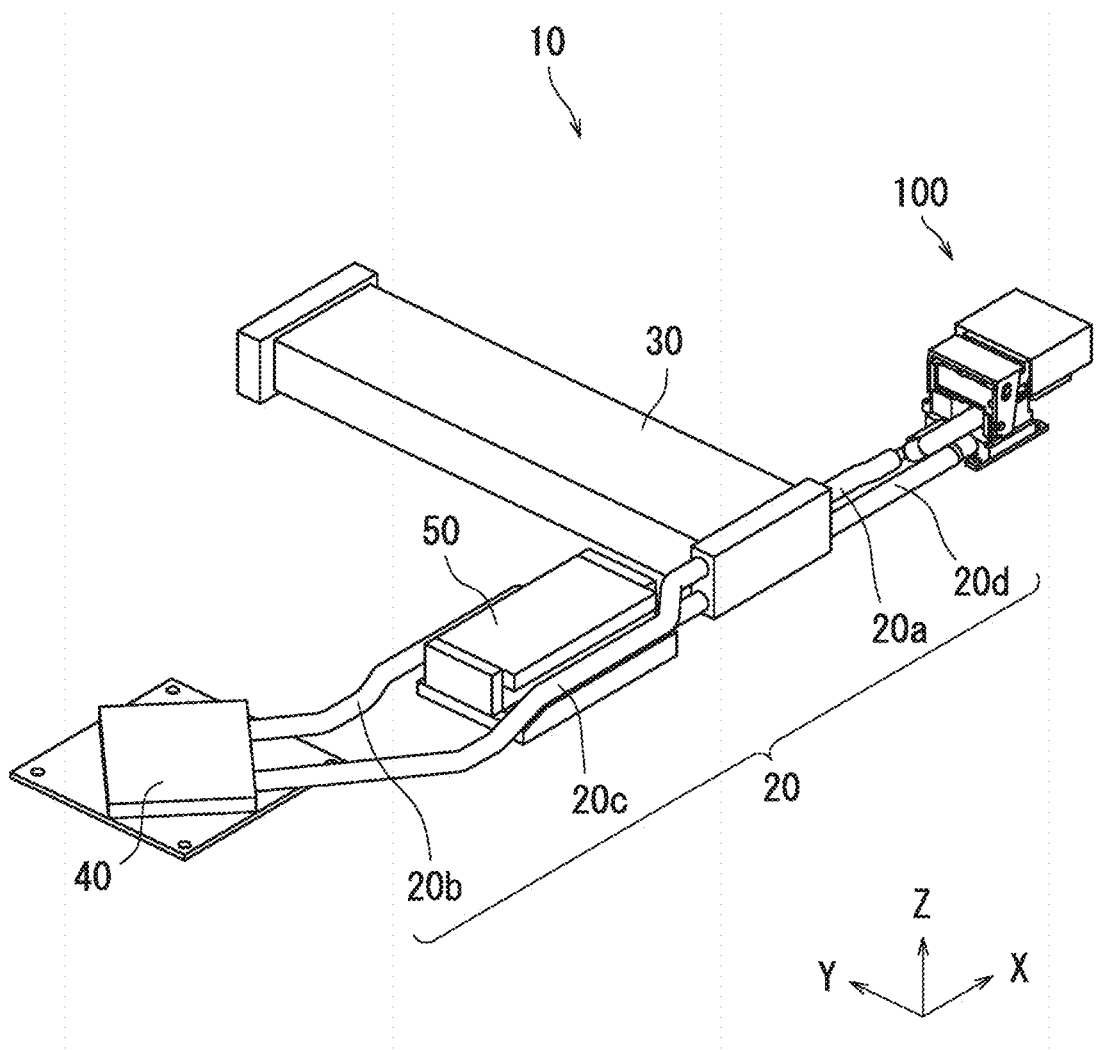
FIG. 1 is a schematic perspective view of a cooling mechanism including a liquid feeder of a first example embodiment of the present disclosure.

Hereinafter, example embodiments of the present disclosure will be described with reference to the accompanying drawings. The same or corresponding parts in the drawings are designated by the same reference numerals, and description thereof will not be duplicated. This specification may describe an X-axis, a Y-axis, and a Z-axis orthogonal to each other to facilitate understanding of the disclosure. Although typically, the Z-axis is parallel to a vertical direction, and the X-axis and the Y-axis are parallel to a horizontal direction, orientations of the X-axis, the Y-axis, and the Z-axis are not limited thereto.

First, a cooling mechanism 10 including a liquid feeder 100 of a first example embodiment will be described with reference to FIG. 1. FIG. 1 is a schematic perspective view of the cooling mechanism 10. The cooling mechanism 10 is used for cooling a target apparatus.

The cooling mechanism 10 includes piping 20, a radiator 30, a cold plate 40, a tank 50, the liquid feeder 100. The cooling mechanism 10 circulates a liquid as a refrigerant. The liquid feeder 100 sequentially feeds the liquid, so that the liquid circulates in the cooling mechanism 10.

The liquid feeder 100, the radiator 30, the cold plate 40, and the tank 50 are connected using the piping 20. The liquid feeder 100 feeds the liquid supplied through the piping 20 toward the radiator 30. The liquid feeder 100 feeds the liquid to the radiator 30 through the piping 20, and the liquid in the piping 20 is cooled in the radiator 30.

The tank 50 stores a replenishing liquid. The tank 50 is connected to the piping 20. Even when the liquid in the piping 20 escapes, the liquid in the tank 50 is replenished to the piping 20.

The cold plate 40 is typically disposed near a heat source. For example, the cold plate 40 is disposed opposite to the heat source. Alternatively, the cold plate 40 may be disposed in contact with the heat source. The liquid cooled in the radiator 30 reaches the cold plate 40. The liquid absorbs heat of the heat source in the cold plate 40.

The liquid circulating in the cooling mechanism 10 may be water. Alternatively, the liquid circulating may be a mixed liquid of water and propylene glycol.

The piping 20 includes a pipe 20a, a pipe 20b, a pipe 20c, and a pipe 20d. The pipe 20a connects the liquid feeder 100 to the radiator 30. The liquid fed from the liquid feeder 100 flows to the radiator 30 through the pipe 20a. The radiator 30 releases heat of the liquid. Thus, the radiator 30 cools the liquid.

The pipe 20b connects the radiator 30 to the cold plate 40. The pipe 20b is connected to the tank 50. The liquid cooled in the radiator 30 flows to the cold plate 40 through the pipe 20b. The liquid cools the heat source in the cold plate 40. Even when the liquid in the piping 20 escapes, the liquid is replenished from the tank 50 to the piping 20.

The pipe 20c connects the cold plate 40 to the radiator 30. The liquid cooled in the radiator 30 flows to the radiator 30 through the pipe 20b. The liquid is cooled in the radiator 30.

The pipe 20d connects the radiator 30 to the liquid feeder 100. The liquid cooled in the radiator 30 flows to the liquid feeder 100 through the pipe 20d. The liquid is pushed out in the liquid feeder 100 and circulated again through the pipe 20a, the pipe 20b, the pipe 20c, and the pipe 20d.

For example, the cooling mechanism 10 may cool an electronic device provided inside with a heating element. The cooling mechanism 10 may cool a circuit of an electronic device. Alternatively, the cooling mechanism 10 may cool a light source or the like of an electronic device. For example, the electronic device may be any of a server, a projector, a notebook personal computer, and a two-dimensional display device.

Figure 2:
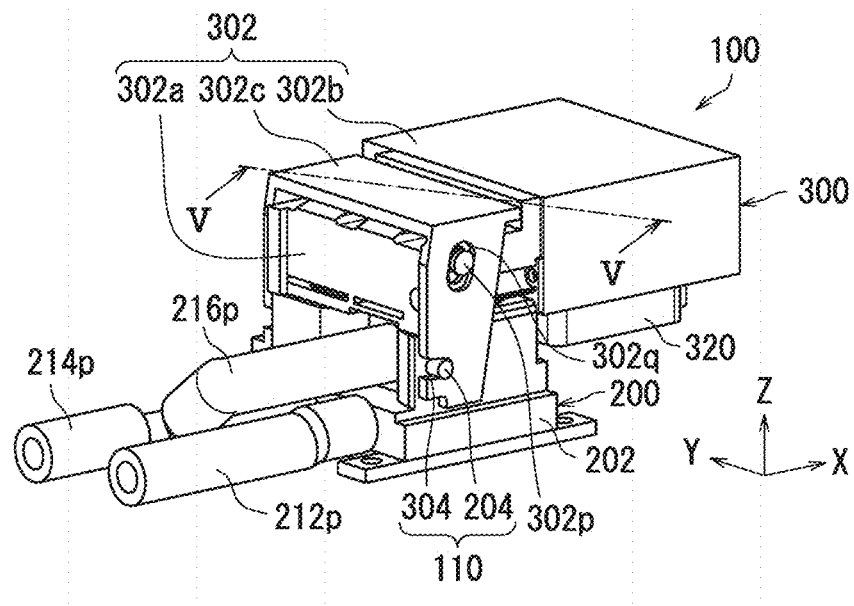
FIG. 2 is a schematic perspective view of the liquid feeder of the first example embodiment.
Figure 3:
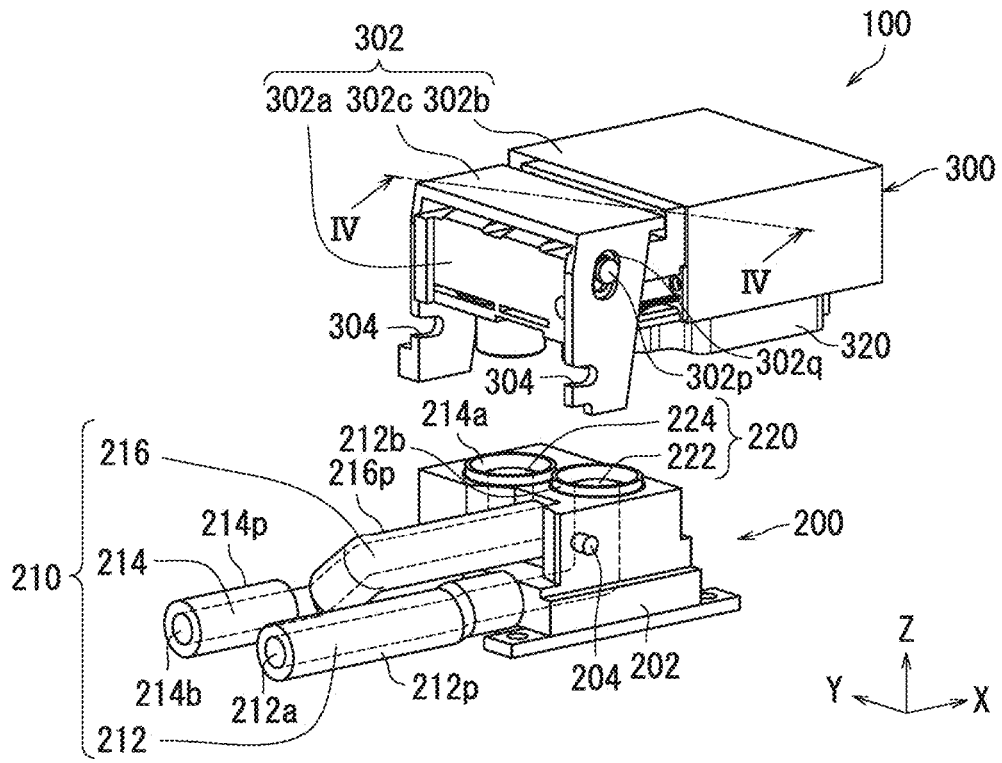
FIG. 3 is a schematic perspective view of the liquid feeder of the first example embodiment.

Next, the liquid feeder 100 of the first example embodiment will be described with reference to FIGS. 2 to 7. FIGS. 2 and 3 are each a schematic perspective view of the liquid feeder 100 of the first example embodiment. FIG. 2 illustrates the liquid feeder 100 in which a pump mechanism 300 is attached to a base mechanism 200. FIG. 3 illustrates the liquid feeder 100 in which the pump mechanism 300 is removed from the base mechanism 200.

As illustrated in FIGS. 2 and 3, the liquid feeder 100 includes the base mechanism 200 and the pump mechanism 300. The base mechanism 200 is detachable from the pump mechanism 300.

As illustrated in FIG. 2, the base mechanism 200 can be attached to the pump mechanism 300. When the base mechanism 200 is attached to the pump mechanism 300, a liquid flows between the base mechanism 200 and the pump mechanism 300.

As illustrated in FIG. 2, the base mechanism 200 includes a base case 202, a pipe 212p, a pipe 214p, and a pipe 216p. The pipe 212p, the pipe 214p, and the pipe 216p are attached to the base case 202.

Specifically, one end of the pipe 212p is attached to the base case 202, and the other end of the pipe 212p is connected to the pipe 20d (FIG. 1). One end of the pipe 214p is attached to the base case 202, and the other end of the pipe 214p is connected to the pipe 20a (FIG. 1). One end of the pipe 216p is attached to the base case 202 above the one end of the pipe 212p. The other end of the pipe 216p is connected to the pipe 214p.

The pump mechanism 300 includes an attachment case 302 and a pump device 320. The base mechanism 200 and the pump device 320 are attached to the attachment case 302. The attachment case 302 has a flow path connecting the base mechanism 200 to the pump device 320. The pump device 320 circulates a liquid. The pump device 320 applies pressure to the liquid having passed through the flow path of the attachment case 302 from the base mechanism 200, and feeds the liquid to the base mechanism 200 through the flow path of the attachment case 302.

As illustrated in FIG. 3, when the pump mechanism 300 is removed from the base mechanism 200, liquid leakage from the base mechanism 200 is prevented. The base mechanism 200 includes a base flow path portion 210 and a base sealing mechanism 220. The base flow path portion 210 includes an inflow port 212a, an outflow port 214b, a first base communication port 212b, a second base communication port 214a, a base inflow path 212, a base outflow path 214, and a bypass outflow path 216. In the base mechanism 200, a liquid flows into the inflow port 212a. The liquid flows out through the outflow port 214b.

Here, the base inflow path 212 is located in the base case 202 and the pipe 212p. The pipe 212p has an end serving as the inflow port 212a.

The base outflow path 214 is located in the base case 202 and the pipe 214p. The pipe 214p has an end serving as the outflow port 214b. The bypass outflow path 216 is located in the base case 202 and the pipe 216p.

As illustrated in FIGS. 2 and 3, the first base communication port 212b is detachable from the pump mechanism 300. At the time of connection to the pump mechanism 300, a liquid having flowed in from the inflow port 212a flows to the pump mechanism 300 through the first base communication port 212b. The base inflow path 212 allows the inflow port 212a to communicate with the first base communication port 212b.

The second base communication port 214a is detachable from the pump mechanism 300. At the time of connection to the pump mechanism 300, a liquid fed from the pump mechanism 300 flows into the second base communication port 214a. The base outflow path 214 allows the second base communication port 214a to communicate with the outflow port 214b.

The bypass outflow path 216 is provided in the middle of a base inflow path 212. The bypass outflow path 216 is branched from the base outflow path 214 allowing the inflow port 212a to communicate with the first base communication port 212b between the inflow port 212a and the first base communication port 212b. The bypass outflow path 216 communicates with the outflow port 214b. Specifically, the bypass outflow path 216 is located in the pipe 216p. The pipe 216p is connected to the pipe 214p. This allows the bypass outflow path 216 to join the base outflow path 214.

The base sealing mechanism 220 includes a first base sealing mechanism 222 and a second base sealing mechanism 224. The first base sealing mechanism 222 seals the first base communication port 212b when the pump mechanism 300 is removed from the base mechanism 200 (FIG. 3). When the pump mechanism 300 is attached to the base mechanism 200 (FIG. 2), the first base sealing mechanism 222 opens the first base communication port 212b. Thus, when the pump mechanism 300 is removed from the base mechanism 200, a liquid can be prevented from leaking from the base inflow path 212 of the base mechanism 200. When the pump mechanism 300 is attached to the base mechanism 200, the liquid flowing through the base inflow path 212 flows into the pump mechanism 300.

The second base sealing mechanism 224 seals the second base communication port 214a when the pump mechanism 300 is removed from the base mechanism 200 (FIG. 3). When the pump mechanism 300 is attached to the base mechanism 200 (FIG. 2), the second base sealing mechanism 224 opens the second base communication port 214a. Thus, when the pump mechanism 300 is removed from the base mechanism 200, a liquid can be prevented from leaking from the base outflow path 214 of the base mechanism 200. When the pump mechanism 300 is attached to the base mechanism 200, the liquid fed from the pump mechanism 300 flows into the base outflow path 214.

The liquid feeder 100 switches a flow path of the liquid having flowed in from the inflow port 212a to any one of a flow path communicating with the first base communication port 212b and the bypass outflow path 216. When the pump mechanism 300 is attached to the base mechanism 200, the liquid feeder 100 closes the bypass outflow path 216 to cause the liquid having flowed in from the inflow port 212a to flow to the pump mechanism 300. When the pump mechanism 300 is removed from the base mechanism 200, the liquid feeder 100 opens the bypass outflow path 216 to cause the liquid having flowed in from the inflow port 212a to flow from the bypass outflow path 216 to the outflow port 214b. Thus, when the pump mechanism 300 is attached to and detached from the base mechanism 200, the flow path of the liquid flowing through the base mechanism 200 can be changed. Thus, even when the pump mechanism 300 is removed from the base mechanism 200, the liquid feeder 100 can cause the liquid to flow through the bypass outflow path 216 while preventing the liquid from leaking.

The attachment case 302 includes a first case 302a, a second case 302b, and a fastening plate 302c. The base mechanism 200 is attached to the first case 302a. The pump device 320 is attached to the second case 302b. The first case 302a and the second case 302b face each other, and the first case 302a and the second case 302b are attached to each other.

The fastening plate 302c is attached to an outer side surface of the first case 302a. The first case 302a is provided in its side surface with a hole corresponding to a shaft 302p, and the shaft 302p is disposed in the hole in the side surface of the first case 302a. In the pump mechanism 300, the shaft 302p is one of shafts 302p extending in +Y direction and −Y direction from side surfaces of the first case 302a on sides in +Y direction and −Y direction, respectively.

The fastening plate 302c has a through-hole 302q. When the shaft 302p is inserted into the hole of the first case 302a through the through-hole 302q of the fastening plate 302c, the fastening plate 302c can be attached to the first case 302a. The fastening plate 302c is rotatably supported by the shaft 302p, and the fastening plate 302c moves in +X-direction and −X-direction.

The base case 202 is provided with a guide 204. The guide 204 is inserted into a hole of the base case 202. In the base mechanism 200, the guide 204 is one of guides 204 extending in +Y-direction and −Y-direction from side surfaces of the base case 202 on sides in +Y-direction and −Y-direction, respectively.

The fastening plate 302c of the pump mechanism 300 is provided with a recess 304. The recess 304 has a size corresponding to a diameter of the guide 204. When the pump mechanism 300 is attached to the base mechanism 200, the guide 204 of the base case 202 is fitted into the recess 304 of the fastening plate 302c, and then the pump mechanism 300 can be locked to the base mechanism 200.

Thus, the guide 204 and the recess 304 constitute a lock mechanism 110. As described above, the liquid feeder 100 further includes the lock mechanism 110 that locks the pump mechanism 300 to the base mechanism 200. This enables the base mechanism 200 and the pump mechanism 300 to be easily locked.

Figure 4:
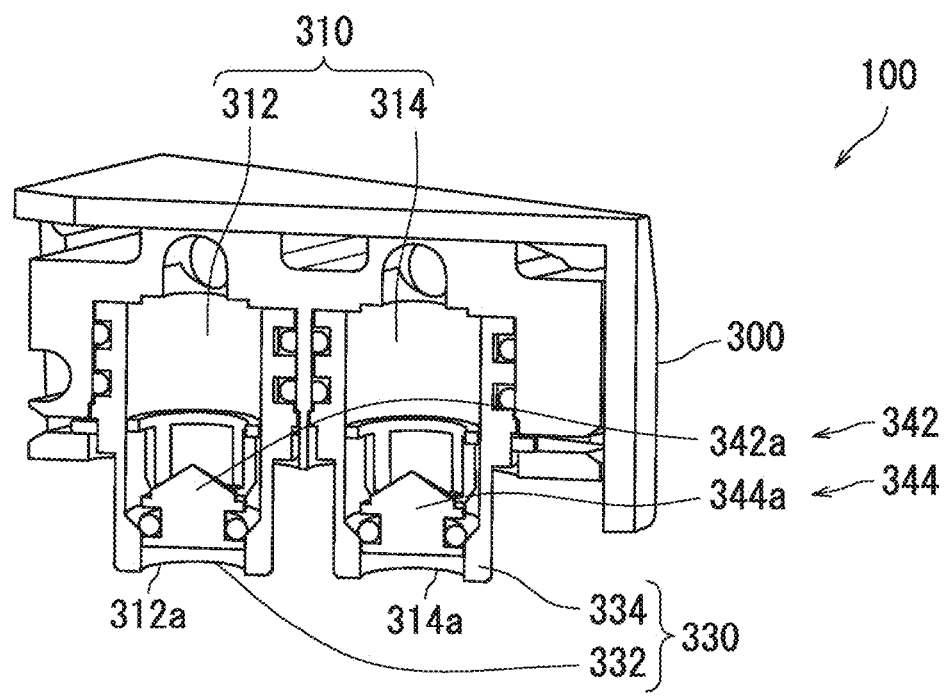
FIG. 4 is a schematic sectional view taken along line IV-IV of FIG. 3.
Figure 4:
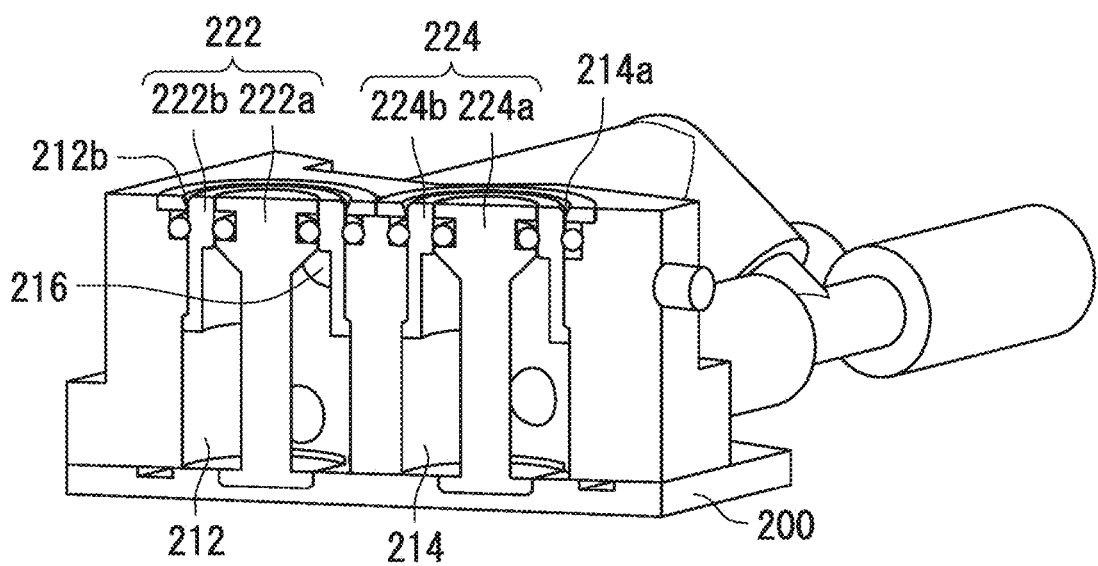
Figure 4:
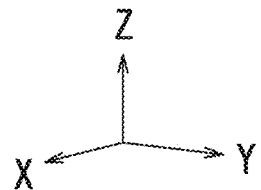

Next, the liquid feeder 100 of the first example embodiment when the pump mechanism 300 is removed from the base mechanism 200 will be described with reference to FIG. 4. FIG. 4 is a schematic sectional view taken along line IV-IV of FIG. 3.

Figure 6:
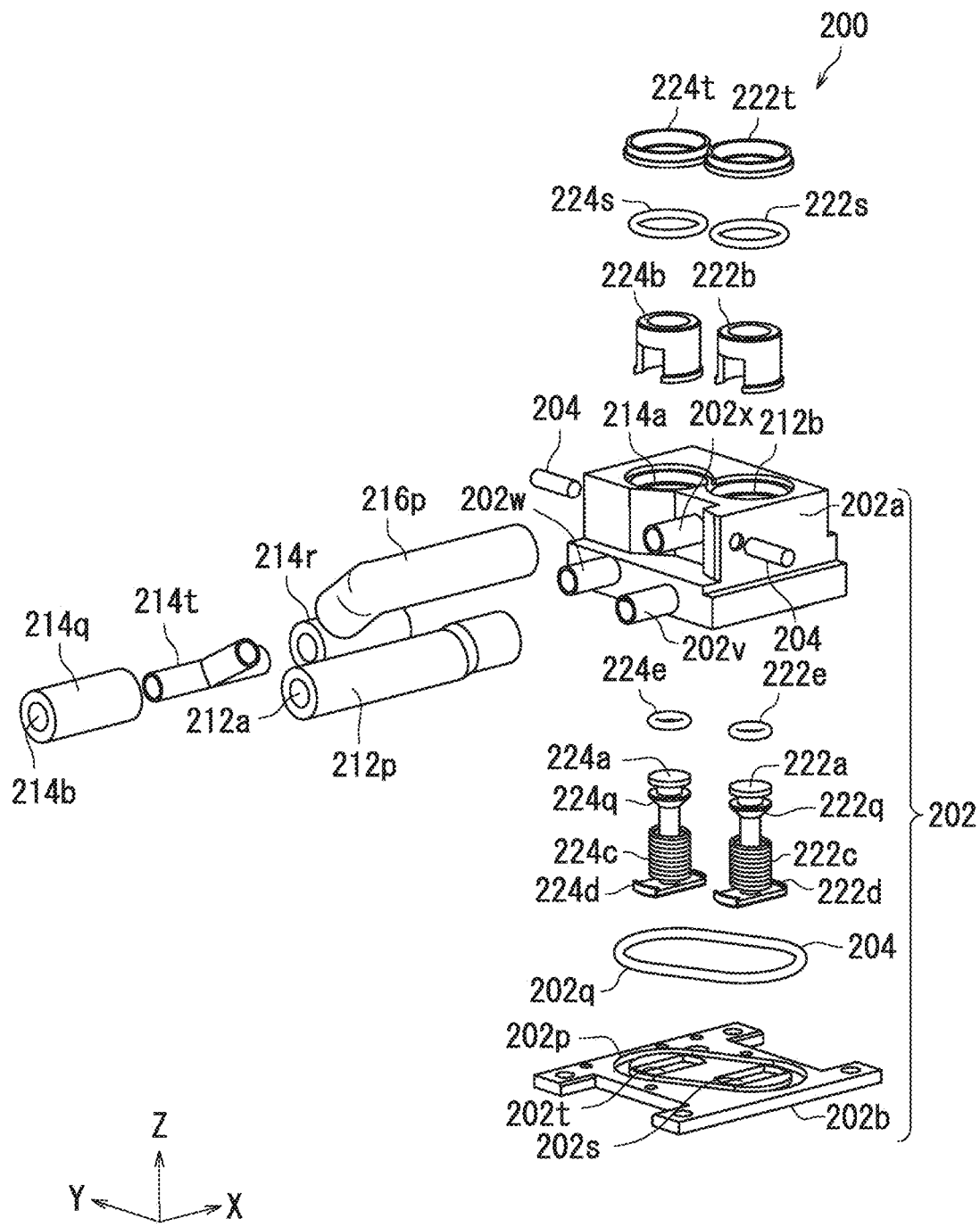
FIG. 6 is a schematic exploded perspective view of a base mechanism in the liquid feeder of the first example embodiment.

As illustrated in FIG. 4, the base mechanism 200 includes the first base sealing mechanism 222 and the second base sealing mechanism 224. The first base sealing mechanism 222 includes a first pillar portion 222a, a first base valve 222b, and a first base pressurizing member 222c (FIG. 6). In FIG. 4, the first base pressurizing member 222c is eliminated to avoid an excessively complicated drawing.

The first pillar portion 222a is disposed in the base inflow path 212. The first pillar portion 222a extends to the first base communication port 212b. The first pillar portion 222a extends along a Z-axis direction. The first base valve 222b is located between an inner surface of the base inflow path 212 and the first pillar portion 222a. The first base valve 222b moves along the base inflow path 212. The first base pressurizing member 222c pressurizes the first base valve 222b toward the first base communication port 212b.

The second base sealing mechanism 224 includes a second pillar portion 224a, a second base valve 224b, and a second base pressurizing member 224c (FIG. 6). In FIG. 4, the second base pressurizing member 224c is eliminated to avoid an excessively complicated drawing.

The second pillar portion 224a is disposed in the base outflow path 214. The second pillar portion 224a extends to the second base communication port 214a. The second pillar portion 224a extends along the Z-axis direction. The second base valve 224b is located between an inner surface of the base outflow path 214 and the second pillar portion 224a. The second base valve 224b moves along the base outflow path 214. The second base pressurizing member 224c pressurizes the second base valve 224b toward the second base communication port 214a.

The first pillar portion 222a has an outer diameter (length along an XY plane) increasing toward its leading end (toward the first base communication port 212b). The first base valve 222b has an inner diameter (length along the XY plane) decreasing toward its leading end (toward the first base communication port 212b). The first pillar portion 222a has an outer diameter on its leading end side that is substantially equal to an inner diameter of the first base valve 222b on its leading end side.

Similarly, the second pillar portion 224a has an outer diameter (length along the XY plane) increasing toward its leading end (toward the second base communication port 214a). The second base valve 224b has an inner diameter (length along the XY plane) decreasing toward its leading end (toward the second base communication port 214a). The second pillar portion 224a has an outer diameter on its leading end side that is substantially equal to an inner diameter of the second base valve 224b on its leading end side.

As illustrated in FIG. 4, when the pump mechanism 300 is removed from the base mechanism 200, the first base valve 222b opens the bypass outflow path 216 and is fitted between the first pillar portion 222a and the first base communication port 212b. When the pump mechanism 300 is removed from the base mechanism 200, the second base valve 224b is fitted between the second pillar portion 224a and the second base communication port 214a.

When the first base valve 222b is fitted onto the first pillar portion 222a in the first base sealing mechanism 222, a liquid can be prevented from leaking from the base inflow path 212. When the second base valve 224b pressurized is fitted onto the second pillar portion 224a in the second base sealing mechanism 224, a liquid can be prevented from leaking from the base outflow path 214.

The pump mechanism 300 includes a pump flow path portion 310, a pump device 320 (FIG. 3), and a pump cylinder 330. The pump cylinder 330 has a tubular shape.

The pump cylinder 330 includes a first pump cylinder 332 and a second pump cylinder 334. The first pump cylinder 332 is housed in the pump flow path portion 310, and a part thereof protrudes from the pump flow path portion 310 to form a first pump communication port 312a. The second pump cylinder 334 is housed in the pump flow path portion 310, and a part thereof protrudes from the pump flow path portion 310 to form a second pump communication port 314a.

The pump flow path portion 310 includes a pump inflow path 312 and a pump outflow path 314. The pump inflow path 312 connects the first pump cylinder 332 to the pump device 320 (FIG. 3). The pump outflow path 314 connects the pump device 320 to the second pump cylinder 334.

The pump mechanism 300 includes a first pump sealing mechanism 342 and a second pump sealing mechanism 344. The first pump sealing mechanism 342 seals the first pump communication port 312a when the pump mechanism 300 is removed from the base mechanism 200. The second pump sealing mechanism 344 seals the second pump communication port 314a when the pump mechanism 300 is removed from the base mechanism 200.

Figure 7:
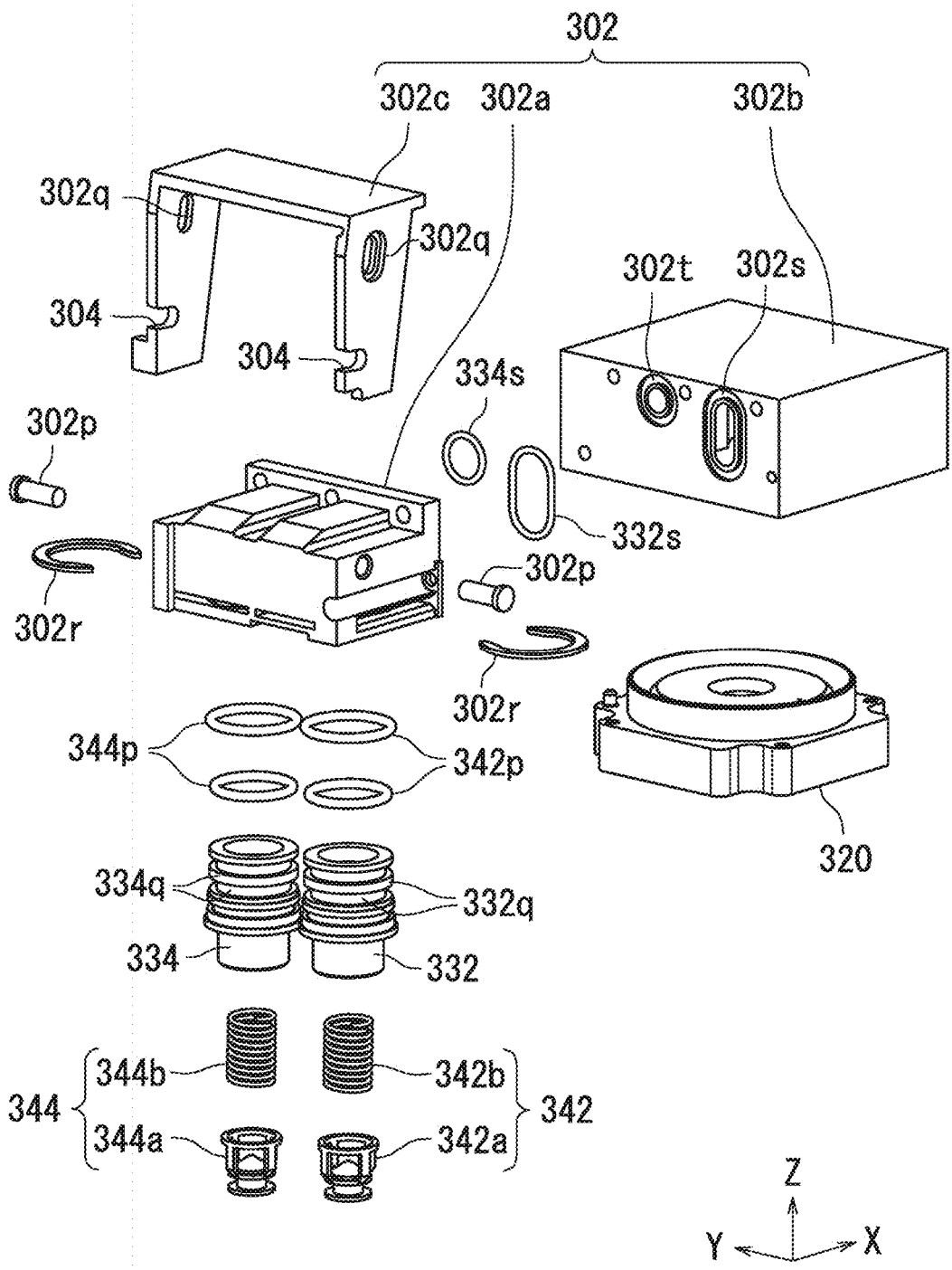
FIG. 7 is a schematic exploded perspective view of a pump mechanism in the liquid feeder of the first example embodiment.

The first pump sealing mechanism 342 includes a first pump valve 342a and a first pump pressurizing member 342b (FIG. 7). In FIG. 4, the first pump pressurizing member 342b is eliminated to avoid an excessively complicated drawing. The first pump valve 342a and the first pump pressurizing member 342b are disposed in the first pump cylinder 332.

The first pump cylinder 332 has an inner diameter (length along the XY plane) decreasing toward its leading end (toward the first pump communication port 312a). The first pump valve 342a has an outer diameter on its leading end side that is substantially equal to an inner diameter of the first pump cylinder 332 on its leading end side.

The first pump valve 342a moves along the first pump cylinder 332 and is fitted into the first pump cylinder 332. The first pump pressurizing member 342b pressurizes the first pump valve 342a toward the first pump communication port 312a. The first pump cylinder 332 has an inner diameter decreasing toward its leading end (toward the first pump communication port 312a). Thus, when the first pump pressurizing member 342b pressurizes the first pump valve 342a toward the first pump communication port 312a, the first pump valve 342a is fitted into the first pump cylinder 332.

The second pump sealing mechanism 344 includes a second pump valve 344a and a second pump pressurizing member 344b (FIG. 7). In FIG. 4, the second pump pressurizing member 344b is eliminated to avoid an excessively complicated drawing. The second pump valve 344a and the second pump pressurizing member 344b are disposed in the second pump cylinder 334.

The second pump cylinder 334 has an inner diameter (length along the XY plane) decreasing toward its leading end (toward the second pump communication port 314a). The second pump valve 344a has an outer diameter on its leading end side that is substantially equal to an inner diameter of the second pump cylinder 334 on its leading end side.

The second pump valve 344a moves along the second pump cylinder 334 and is fitted into the second pump cylinder 334. The second pump pressurizing member 344b pressurizes the second pump valve 344a toward the second pump communication port 314a. The second pump cylinder 334 has an inner diameter decreasing toward its leading end (toward the second pump communication port 314a). Thus, when the second pump pressurizing member 344b pressurizes the second pump valve 344a toward the second pump communication port 314a, the second pump valve 344a is fitted into the second pump cylinder 334.

When the pump mechanism 300 is removed from the base mechanism 200, the first pump valve 342a pressurized is fitted into the first pump cylinder 332 in the first pump sealing mechanism 342, and the second pump valve 344a pressurized is fitted into the second pump cylinder 334 in the second pump sealing mechanism 344. This seals a liquid that flows out from each of the first pump cylinder 332 and the second pump cylinder 334.

Figure 5:
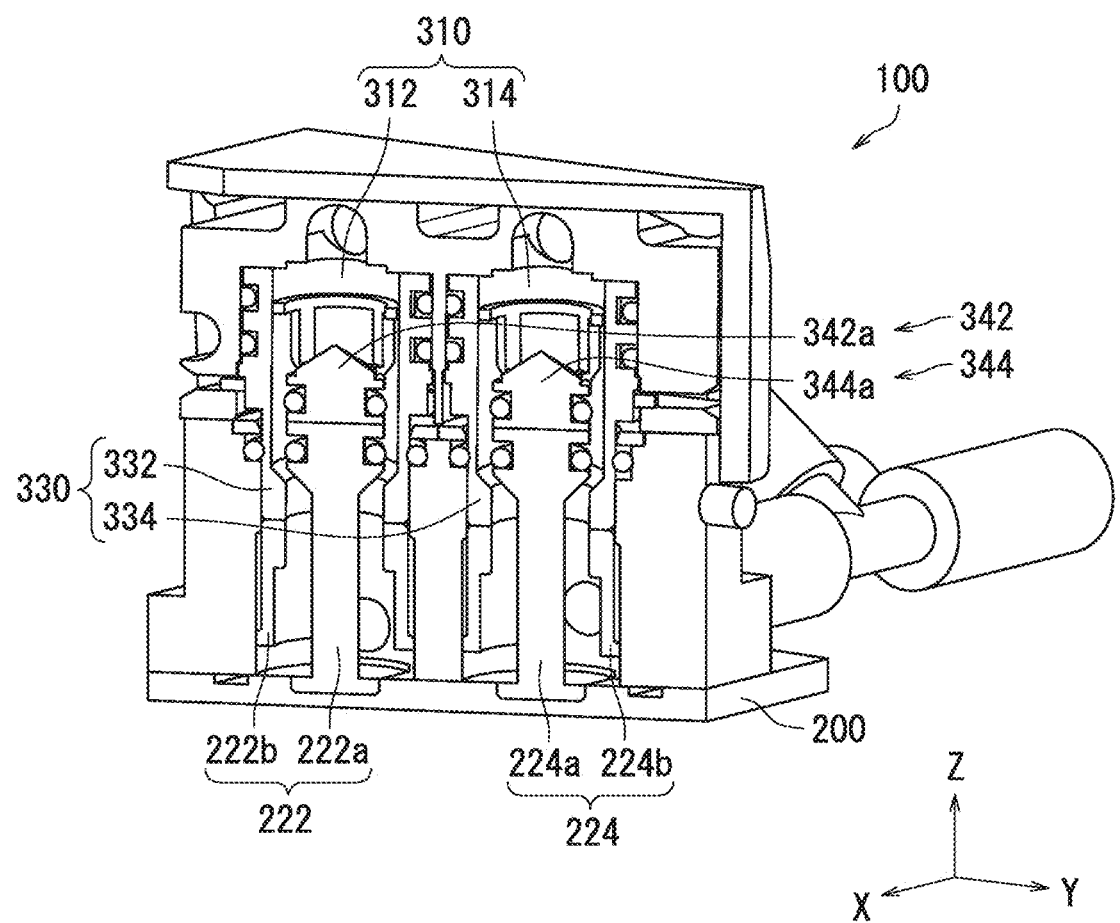
FIG. 5 is a schematic sectional view taken along line V-V of FIG. 2.

Next, the liquid feeder 100 of the first example embodiment when the pump mechanism 300 is attached to the base mechanism 200 will be described with reference to FIGS. 2 to 5. FIG. 5 is a schematic sectional view taken along line V-V of FIG. 2.

When the pump mechanism 300 is attached to the base mechanism 200, the first base valve 222b seals the bypass outflow path 216 (FIG. 4) and opens a space between the first pillar portion 222a and the first base communication port 212b. When the pump mechanism 300 is attached to the base mechanism 200, the second base valve 224b opens a space between the second pillar portion 224a and the second base communication port 214a.

The first pump cylinder 332 has an inner diameter and an outer diameter on its leading end side (a first pump communication port 312a side) that are substantially equal to an inner diameter and an outer diameter of the first base valve 222b on its leading end side (a first base communication port 212b side), respectively. A part of the first pump cylinder 332 protrudes from the pump flow path portion 310.

The second pump cylinder 334 has an inner diameter and an outer diameter on its leading end side (a second pump communication port 314a side) that are substantially equal to an inner diameter and an outer diameter of the second base valve 224b on its leading end side (a second base communication port 214a side), respectively. A part of the second pump cylinder 334 protrudes from the pump flow path portion 310.

Thus, when the pump mechanism 300 is attached to the base mechanism 200, the first pump cylinder 332 presses the first base valve 222b in a direction away from the first base communication port 212b to seal the bypass outflow path 216. When the pump mechanism 300 is attached to the base mechanism 200, the second pump cylinder 334 presses the second base valve 224b in a direction away from the second base communication port 214a. Thus, when the first pump cylinder 332 is attached to and detached from the base mechanism 200, a flow path in the pump mechanism 300 or the base mechanism 200 can be switched.

As illustrated in FIGS. 4 and 5, when the pump mechanism 300 is removed from the base mechanism 200, the first base valve 222b opens the bypass outflow path 216 and is fitted between the first pillar portion 222a and the first base communication port 212b. When the pump mechanism 300 is removed from the base mechanism 200, the second base valve 224b is fitted between the second pillar portion 224a and the second base communication port 214a.

When the first base valve 222b pressurized is fitted onto the first pillar portion 222a in the first base sealing mechanism 222, a liquid is sealed to be prevented from flowing out through the first base communication port 212b. When the second base valve 224b pressurized is fitted onto the second pillar portion 224a in the second base sealing mechanism 224, a liquid is sealed to be prevented from flowing out through the second base communication port 214a.

Next, the base mechanism 200 in the liquid feeder 100 of the first example embodiment will be described with reference to FIGS. 2 to 6. FIG. 6 is a schematic exploded perspective view of the base mechanism 200 in the liquid feeder 100 of the first example embodiment.

As illustrated in FIG. 6, the base case 202 includes a main body part 202a and a base portion 202b. The main body part 202a is supported by the base portion 202b.

The main body part 202a is provided in its side surfaces on sides in +Y-direction and −Y-direction with respective guides 204. The base portion 202b is provided in its side surface on a side in −X-direction with attachment ports 202v, 202w, and 202x.

One end of the pipe 212p is attached to the attachment port 202v. The other end of the pipe 212p serves as the inflow port 212a.

The pipe 214r, the pipe 214q, and the pipe 216p are attached to a T-shaped pipe 214t having three openings. The T-shaped pipe 214t is also called a cheese pipe.

One end of the pipe 214q is attached to one end of the T-shaped pipe 214t. The other end of the pipe 214q serves as the outflow port 214b.

One end of the pipe 214r is attached to another end of the T-shaped pipe 214t. The other end of the pipe 214r is attached to the attachment port 202w of the main body part 202a.

One end of the pipe 216p is attached to the remaining end of the T-shaped pipe 214t. The other end of the pipe 216p is attached to the attachment port 202x of the main body part 202a.

Thus, the pipe 212p constitutes a part of the base inflow path 212. The pipe 214r, the T-shaped pipe 214t, and the pipe 214r constitute a part of the base outflow path 214. The pipe 216p constitutes a part of the bypass outflow path 216.

The base portion 202b is provided with a hole 202p in an annular shape, and holes 202s and 202t in a rectangular parallelepiped shape. A sealing member 202q in an annular shape is fitted into the hole 202p. The sealing member 202q is disposed between the main body part 202a and the base portion 202b to prevent liquid leakage.

The first base valve 222b and the first base pressurizing member 222c are disposed on the first pillar portion 222a. Here, the first base pressurizing member 222c is a coil spring. The first base pressurizing member 222c is inserted onto the first pillar portion 222a. The first pillar portion 222a is provided at its one end (end on a side in +Z-direction) with a recess 222q in an annular shape, and a sealing member 222e in an annular shape is disposed in the recess 222q. The first pillar portion 222a has the other end (end on a side in −Z-direction) to which a plate 222d is attached. The plate 222d extends in X-direction. The plate 222d prevents the first base pressurizing member 222c from being detached from the first pillar portion 222a.

The second base valve 224b and the second base pressurizing member 224c are disposed on the second pillar portion 224a. Here, the second base pressurizing member 224c is a coil spring. The second base pressurizing member 224c is inserted onto the second pillar portion 224a. The second pillar portion 224a is provided at its one end (end on a side in +Z-direction) with a recess 224q in an annular shape, and a sealing member 224e in an annular shape is disposed in the recess 224q. The second pillar portion 224a has the other end (end on a side in −Z-direction) to which a plate 224d is attached. The plate 224d extends in X-direction. The plate 224d prevents the second base pressurizing member 224c from being detached from the second pillar portion 224a.

The holes 202s and 202t are provided in a region surrounded by the hole 202p. The holes 202s and 202t extend in X-direction. In the hole 202s, the plate 222d attached to the first pillar portion 222a is disposed. In the hole 202t, the plate 224d attached to the second pillar portion 224a is disposed.

In the first base communication port 212b of the main body part 202a, a sealing member 222s and a cover member 222t are disposed. The sealing member 222s and the cover member 222t are each in an annular shape. The sealing member 222s is located between the main body part 202a and the cover member 222t, and is covered with the cover member 222t.

The cover member 222t has an inner diameter that is slightly smaller than the outer diameter of the first base valve 222b. Thus, even when the first base valve 222b is pressurized by the first base pressurizing member 222c, the cover member 222t prevents the first base valve 222b from coming off from the main body part 202a.

In the second base communication port 214a of the main body part 202a, a sealing member 224s and a cover member 224t are disposed. The sealing member 224s and the cover member 224t are each in an annular shape. The sealing member 224s is located between the main body part 202a and the cover member 224t, and is covered with the cover member 224t.

The cover member 224t has an inner diameter that is slightly smaller than the outer diameter of the second base valve 224b. Thus, even when the second base valve 224b is pressurized by the second base pressurizing member 224c, the cover member 224t prevents the second base valve 224b from coming off from the main body part 202a. The base mechanism 200 has the configuration as described above.

Next, the pump mechanism 300 in the liquid feeder 100 of the first example embodiment will be described with reference to FIG. 7. FIG. 7 is a schematic perspective view of the pump mechanism 300 in the liquid feeder 100 of the first example embodiment.

As illustrated in FIG. 7, the pump mechanism 300 includes the attachment case 302 and the pump device 320. The attachment case 302 includes a first case 302a, a second case 302b, and a fastening plate 302c. The base mechanism 200 is attached to the first case 302a. The pump device 320 is attached to the second case 302b. The first case 302a and the second case 302b face each other, and the first case 302a and the second case 302b are attached to each other.

Specifically, the second case 302b is provided with a hole 302s in an annular shape and a hole 302t in an annular shape. The holes 302s and 302t are each provided inside with a flow path of liquid. A sealing member 332s in an annular shape is fitted into the hole 302s in an annular shape, and a sealing member 334s in an annular shape is fitted into the hole 302t in an annular shape. The sealing members 332s and 334s are disposed between the first case 302a and the second case 302b to prevent liquid leakage.

The shaft 302p and a fastener 302r are attached to each of side surfaces of the first case 302a on a side in +Y-direction and on a side in −Y-direction.

The fastening plate 302c is attached to the outer side surface of the first case 302a. The shaft 302p is provided on a side surface of the first case 302a, and the fastening plate 302c has a through-hole 302q. The first case 302a is provided with a hole corresponding to the shaft 302p. When the shaft 302p is inserted into the hole of the first case 302a through the through-hole 302q of the fastening plate 302c, the fastening plate 302c can be attached to the first case 302a.

The first pump cylinder 332, the second pump cylinder 334, the first pump sealing mechanism 342, and the second pump sealing mechanism 344 are mounted on a bottom surface of the first case 302a on a side in −Z-direction.

The first pump sealing mechanism 342 includes the first pump valve 342a and the first pump pressurizing member 342b. The first pump valve 342a and the first pump pressurizing member 342b are disposed in the first pump cylinder 332.

The first pump cylinder 332 is provided at its one end (end on a side in +Z-direction) with a recess 332q in an annular shape, and a sealing member 342p in an annular shape is disposed in the recess 332q.

The second pump sealing mechanism 344 includes the second pump valve 344a and the second pump pressurizing member 344b. The second pump valve 344a and the second pump pressurizing member 344b are disposed in the second pump cylinder 334.

The second pump cylinder 334 is provided at its one end (end on a side in +Z-direction) with a recess 334q in an annular shape, and a sealing member 344p in an annular shape is disposed in the recess 334q. The pump mechanism 300 has the configuration as described above.

The cooling mechanism 10 illustrated in FIG. 1 includes one liquid feeder 100, and prevents liquid leakage from the piping 20 when the pump mechanism 300 of the liquid feeder 100 is replaced or repaired. However, the present example embodiment is not limited thereto. The cooling mechanism 10 may include two or more liquid feeders 100. When the pump mechanism 300 of the liquid feeder 100 is replaced or repaired, liquid leakage from the piping 20 can be prevented.

Figure 8:
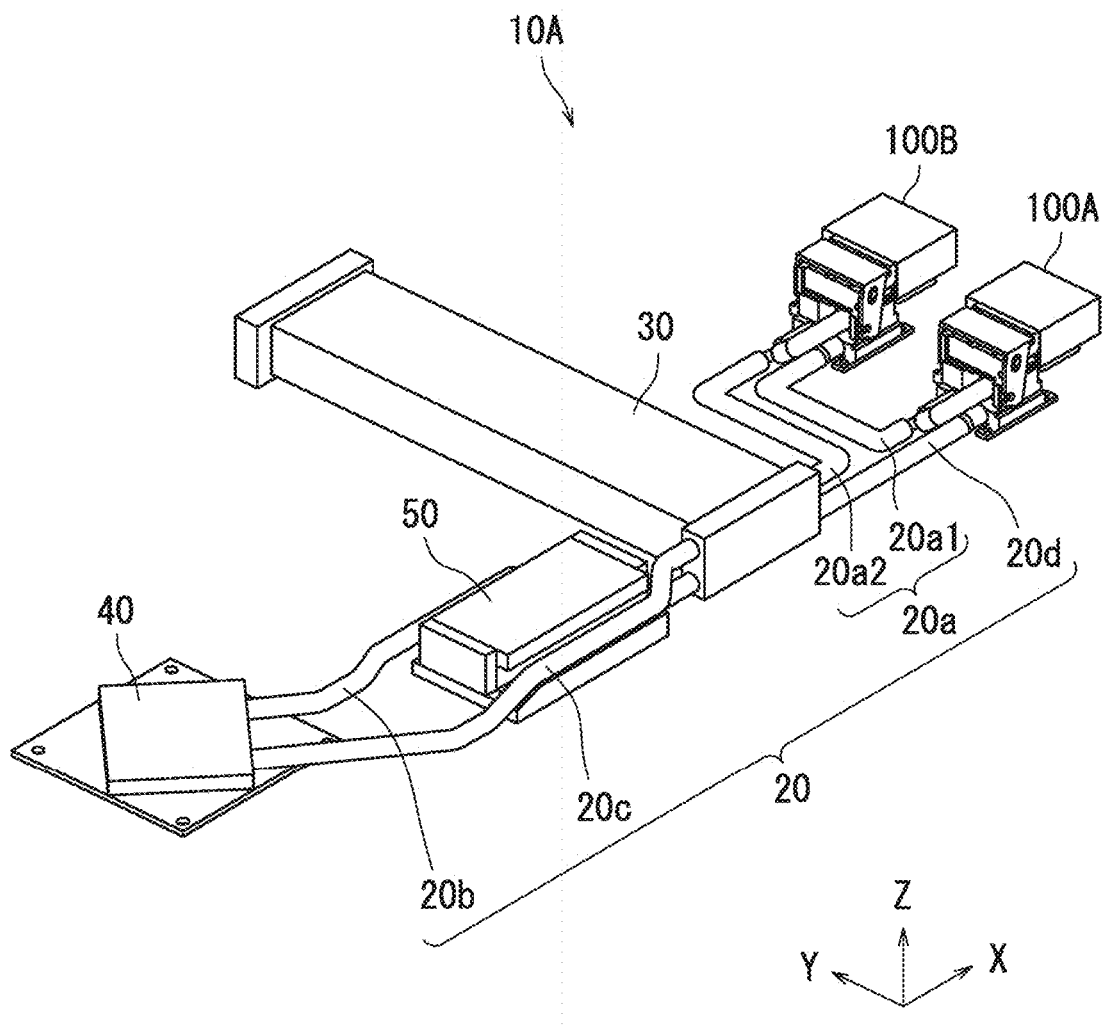
FIG. 8 is a schematic perspective view of a cooling mechanism having the liquid feeder of the first example embodiment.

Next, a cooling mechanism 10A including liquid feeders 100A and 100B of the first example embodiment will be described with reference to FIG. 8. FIG. 8 is a schematic diagram of the cooling mechanism 10A. The cooling mechanism 10A is used for cooling a target apparatus. The cooling mechanism 10A in FIG. 8 has a configuration similar to that of the cooling mechanism 10 described above with reference to FIG. 1 except including liquid feeders 100A and 100B, and duplicated description will be eliminated to avoid redundancy.

As illustrated in FIG. 8, the cooling mechanism 10A includes piping 20, a radiator 30, a cold plate 40, a tank 50, the liquid feeder 100A, and the liquid feeder 100B. The cooling mechanism 10A circulates a liquid as a refrigerant. The liquid feeders 100A and 100B feed the liquid, so that the liquid circulates in the cooling mechanism 10A.

The liquid feeders 100A and 100B, the radiator 30, the cold plate 40, and the tank 50 are connected using the piping 20. The liquid feeders 100A and 100B feed the liquid supplied through the piping 20 toward the radiator 30. The liquid feeders 100A and 100B feed the liquid to the radiator 30 through the piping 20, and the liquid in the piping 20 is cooled in the radiator 30.

The piping 20 includes a pipe 20a, a pipe 20b, a pipe 20c, and a pipe 20d. The pipe 20a connects the liquid feeders 100A and 100B to the radiator 30. Specifically, the pipe 20a includes a pipe 20a1 and a pipe 20a2.

The pipe 20a1 connects the liquid feeder 100A to the liquid feeder 100B. The liquid fed from the liquid feeder 100A flows to the liquid feeder 100B through the pipe 20a1. The pipe 20a2 connects the liquid feeder 100B to the radiator 30. The liquid fed from the liquid feeder 100B flows to the radiator 30 through the pipe 20a2.

The cooling mechanism 10A illustrated in FIG. 8 includes the liquid feeders 100A and 100B that each have a configuration similar to that of the liquid feeder 100 described above with reference to FIGS. 2 to 7. Thus, even when one pump of the liquid feeders 100A and 100B is stopped and the pump mechanism is removed from the liquid feeder stopped to replace a pump of the liquid feeder, the liquid can be continued to flow. This allows the other of the liquid feeders 100A and 100B to be continued to be driven, so that cooling can be continued. Additionally, liquid leakage from the liquid feeder from which the pump mechanism is removed can be prevented.

Although the cooling mechanism 10A illustrated in FIG. 8 includes the liquid feeders 100A and 100B, the present example embodiment is not limited thereto. The cooling mechanism may include three or more liquid feeders. In this case, the cooling mechanism 10 can use a pump of each liquid feeder, so that a flow velocity and a flow rate of a liquid flowing through the piping 20 can be further increased.

In the above description with reference to FIGS. 2 to 7, the base mechanism 200 includes a plurality of pipes attached to the base case 202, and the bypass outflow path 216 communicates with the outflow port 214b through the pipe 216p. However, the present example embodiment is not limited thereto.

Next, a liquid feeder 100 of a second example embodiment will be described with reference to FIGS. 9 to 14. In the liquid feeder 100 of the second example embodiment described with reference to FIGS. 9 to 14, duplicated description of a configuration similar to that of the liquid feeder 100 of the first example embodiment described above with reference to FIGS. 2 to 7 will be eliminated to avoid redundancy.

Figure 9:
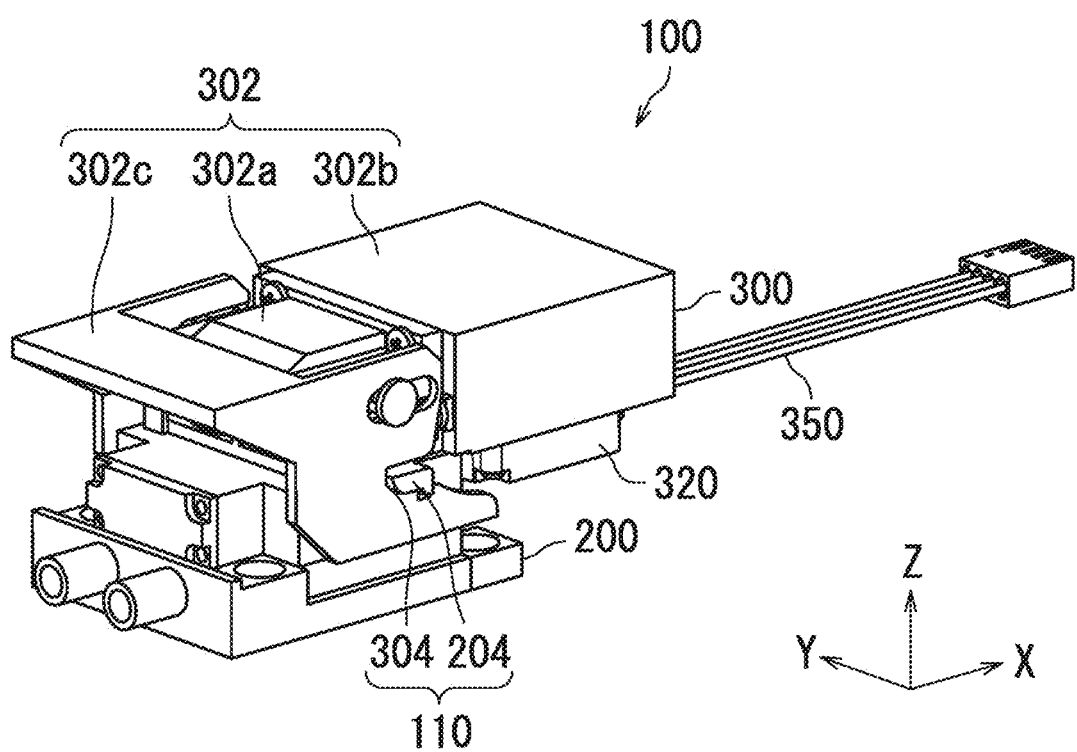
FIG. 9 is a schematic diagram of a liquid feeder of a second example embodiment of the present disclosure.

FIG. 9 is a schematic perspective view of the liquid feeder 100 of the second example embodiment. FIG. 9 illustrates the liquid feeder 100 in which a pump mechanism 300 is attached to a base mechanism 200.

As illustrated in FIG. 9, the liquid feeder 100 includes the base mechanism 200 and the pump mechanism 300. The base mechanism 200 is detachable from the pump mechanism 300. The pump mechanism 300 includes an attachment case 302, a pump device 320, and a flexible printed circuit (FPC) 350. The FPC 350 supplies electric power to the pump device 320.

The attachment case 302 includes a first case 302a, a second case 302b, and a fastening plate 302c. The base mechanism 200 is attached to the first case 302a. The pump device 320 is attached to the second case 302b. The first case 302a and the second case 302b face each other, and the first case 302a and the second case 302b are attached to each other.

Figure 10:
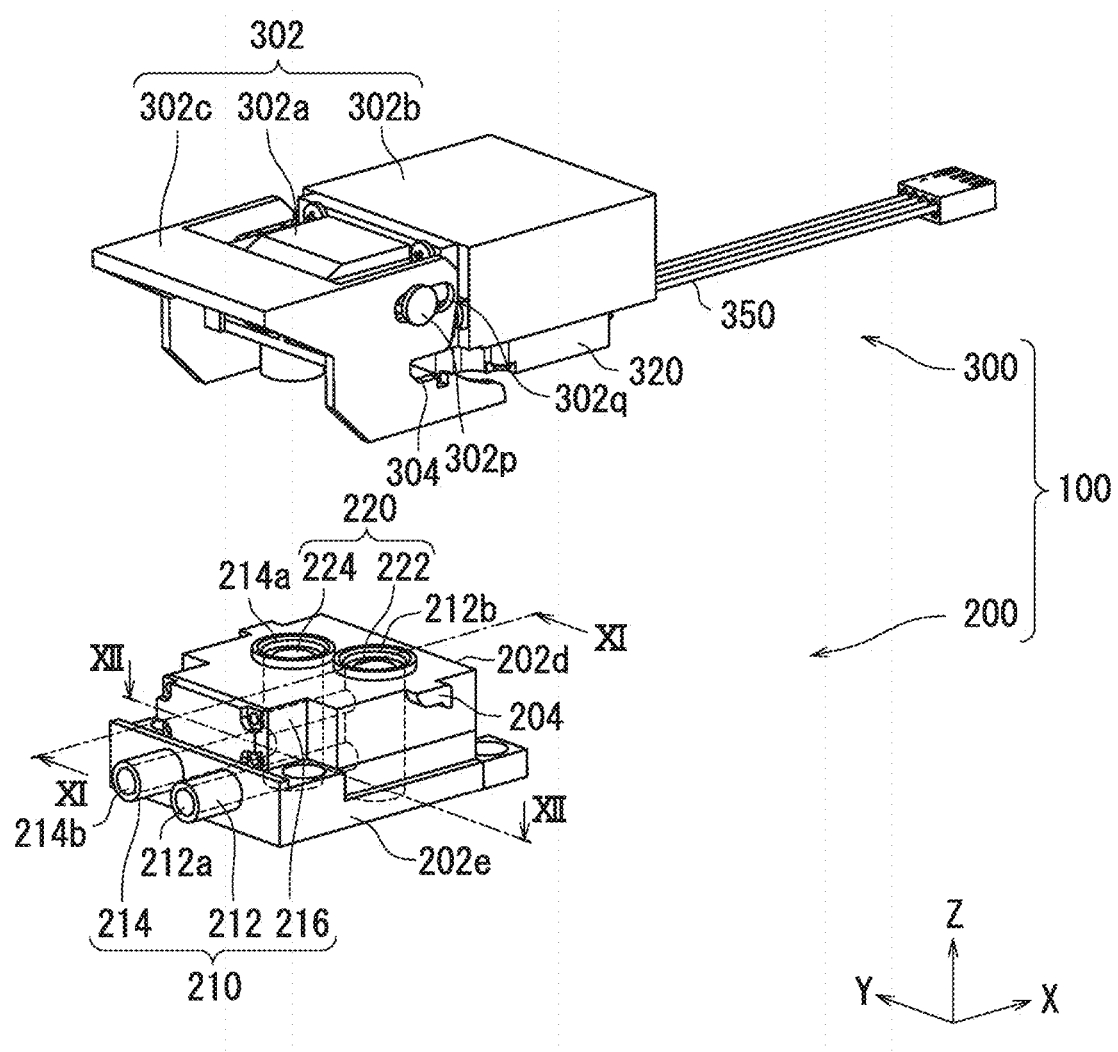
FIG. 10 is a schematic diagram of the liquid feeder of the second example embodiment.

Next, the liquid feeder 100 of the second example embodiment will be described with reference to FIGS. 9 and 10. FIG. 10 is a schematic perspective view of the liquid feeder 100 of the second example embodiment. FIG. 10 illustrates the liquid feeder 100 in which the pump mechanism 300 is removed from the base mechanism 200.

As illustrated in FIG. 10, the base mechanism 200 includes an upper base portion 202d and a lower base portion 202e. The upper base portion 202d has a first base communication port 212b and a second base communication port 214a. The lower base portion 202e has an inflow port 212a and an outflow port 214b. The upper base portion 202d and the lower base portion 202e are divided at positions of a base inflow path 212 and a base outflow path 214.

When the pump mechanism 300 is removed from the base mechanism 200, liquid leakage from the base mechanism 200 is prevented. The base mechanism 200 includes a base flow path portion 210 and a base sealing mechanism 220. The base flow path portion 210 includes an inflow port 212a, an outflow port 214b, a first base communication port 212b, a second base communication port 214a, a base inflow path 212, a base outflow path 214, and a bypass outflow path 216. In the base mechanism 200, a liquid flows into the inflow port 212a and flows out from the outflow port 214b.

The first base communication port 212b is detachable from the pump mechanism 300. At the time of connection to the pump mechanism 300, a liquid having flowed in from the inflow port 212a flows to the pump mechanism 300 through the first base communication port 212b. The base inflow path 212 allows the inflow port 212a to communicate with the first base communication port 212b.

The second base communication port 214a is detachable from the pump mechanism 300. At the time of connection to the pump mechanism 300, a liquid fed from the pump mechanism 300 flows into the second base communication port 214a. The base outflow path 214 allows the second base communication port 214a to communicate with the outflow port 214b.

The bypass outflow path 216 is provided in the middle of a base inflow path 212. The bypass outflow path 216 communicates with the outflow port 214b.

The base sealing mechanism 220 includes a first base sealing mechanism 222 and a second base sealing mechanism 224. The first base sealing mechanism 222 seals the first base communication port 212b when the pump mechanism 300 is removed from the base mechanism 200 (FIG. 10). When the pump mechanism 300 is attached to the base mechanism 200 (FIG. 9), the first base sealing mechanism 222 opens the first base communication port 212b. Thus, when the pump mechanism 300 is attached to the base mechanism 200, the liquid flowing through the base inflow path 212 flows into the pump mechanism 300.

The second base sealing mechanism 224 seals the second base communication port 214a when the pump mechanism 300 is removed from the base mechanism 200 (FIG. 10). When the pump mechanism 300 is attached to the base mechanism 200 (FIG. 9), the second base sealing mechanism 224 opens the second base communication port 214a. Thus, when the pump mechanism 300 is attached to the base mechanism 200, the liquid fed from the pump mechanism 300 flows into the base outflow path 214.

As illustrated in FIGS. 9 and 10, the pump mechanism 300 includes the attachment case 302 and the pump device 320. The base mechanism 200 and the pump device 320 are attached to the attachment case 302. The attachment case 302 has a flow path connecting the base mechanism 200 to the pump device 320. The pump device 320 applies pressure to the liquid having passed through the flow path of the attachment case 302 from the base mechanism 200, and feeds the liquid to the base mechanism 200 through the flow path of the attachment case 302.

The attachment case 302 includes a first case 302a, a second case 302b, and a fastening plate 302c. The base mechanism 200 is attached to the first case 302a. The pump device 320 is attached to the second case 302b. The first case 302a and the second case 302b face each other, and the first case 302a and the second case 302b are attached to each other.

The fastening plate 302c is attached to the outer side surface of the first case 302a. The shaft 302p is provided on a side surface of the first case 302a, and the fastening plate 302c has a through-hole 302q. The first case 302a is provided with a hole corresponding to the shaft 302p. When the shaft 302p is inserted into the hole of the first case 302a through the through-hole 302q of the fastening plate 302c, the fastening plate 302c can be attached to the first case 302a.

The guide 204 extends from the upper base portion 202d. In the base mechanism 200, the guide 204 is one of guides 204 extending in +Y-direction and −Y-direction from side surfaces of the upper base portion 202d on sides in +Y-direction and −Y-direction, respectively.

The fastening plate 302c of the pump mechanism 300 is provided with a recess 304. The recess 304 has a size corresponding to a diameter of the guide 204.

When the pump mechanism 300 is attached to the base mechanism 200, the guide 204 of the upper base portion 202d is fitted into the recess 304 of the fastening plate 302c, and then the pump mechanism 300 can be locked to the base mechanism 200.

Thus, the guide 204 and the recess 304 constitute a lock mechanism 110. As described above, the liquid feeder 100 further includes the lock mechanism 110 that locks the pump mechanism 300 to the base mechanism 200. This enables the base mechanism 200 and the pump mechanism 300 to be easily locked.

Figure 11:
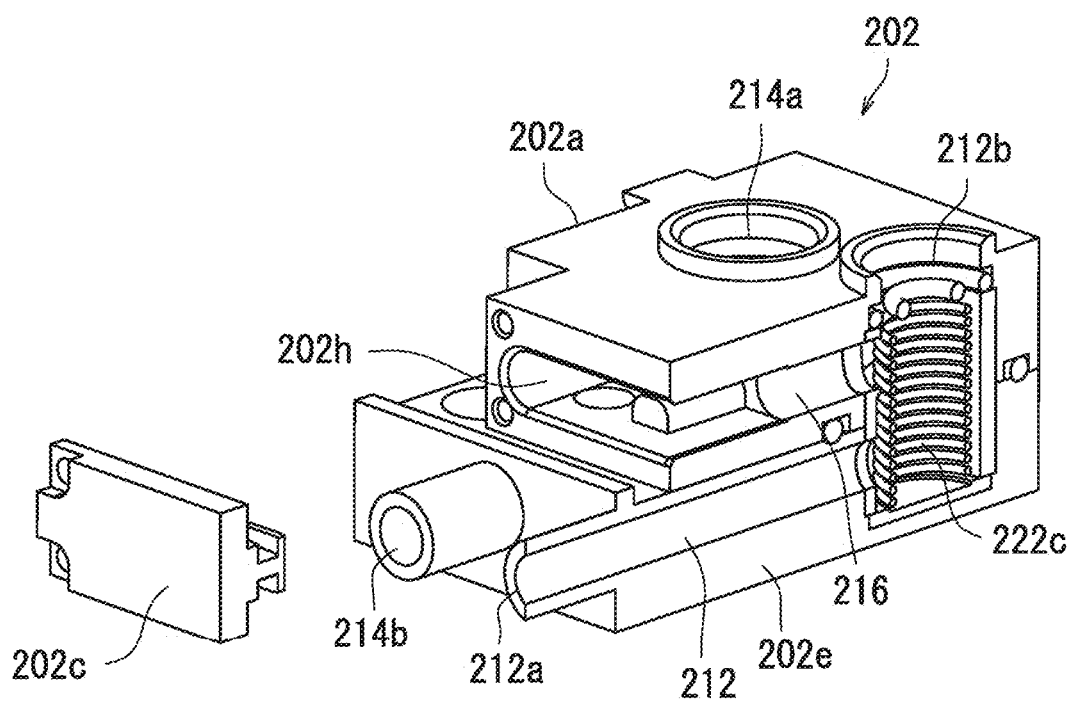
FIG. 11 is a schematic sectional view taken along line XI-XI of FIG. 10.

Next, the base mechanism 200 in the liquid feeder 100 of the second example embodiment will be described with reference to FIGS. 11 and 12. FIG. 11 is a schematic sectional view taken along line XI-XI of FIG. 10, and FIG. 12 is a schematic sectional view taken along line XII-XII of FIG. 10.

Figure 12:
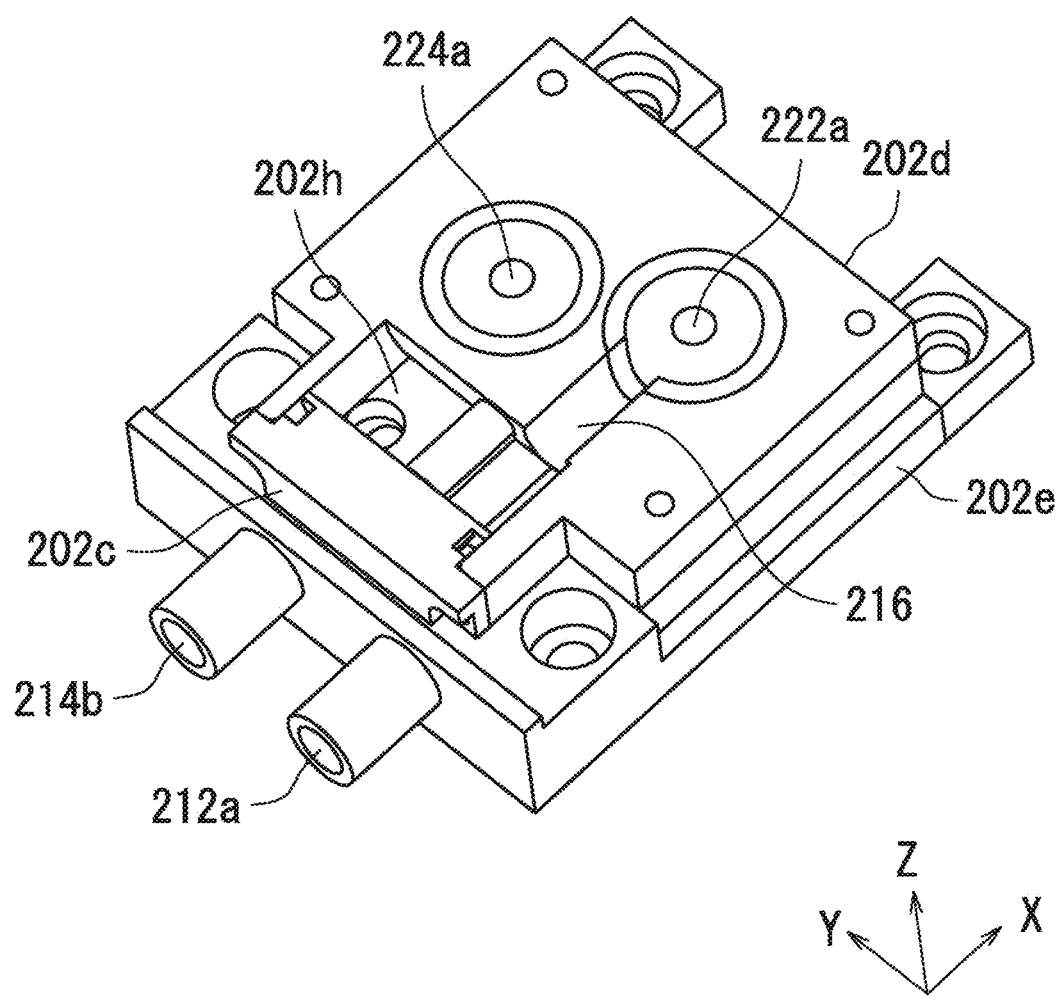
FIG. 12 is a schematic sectional view taken along line XII-XII of FIG. 10.

As illustrated in FIGS. 11 and 12, the base mechanism 200 includes the upper base portion 202d, the lower base portion 202e, and a cover member 202c. The upper base portion 202d is provided with a communication hole 202h. The communication hole 202h allows the base inflow path 212 to communicate with the base outflow path 214 inside the upper base portion 202d. Thus, the communication hole 202h serves as a part of the bypass outflow path 216. When the pump mechanism 300 is removed from the base mechanism 200 as illustrated in FIG. 10, a liquid flows through the communication hole 202h as a part of the bypass outflow path 216.

The communication hole 202h is covered with the cover member 202c. Thus, even when a liquid flows through the communication hole 202h, liquid leakage from the liquid feeder 100 can be prevented.

Figure 13:
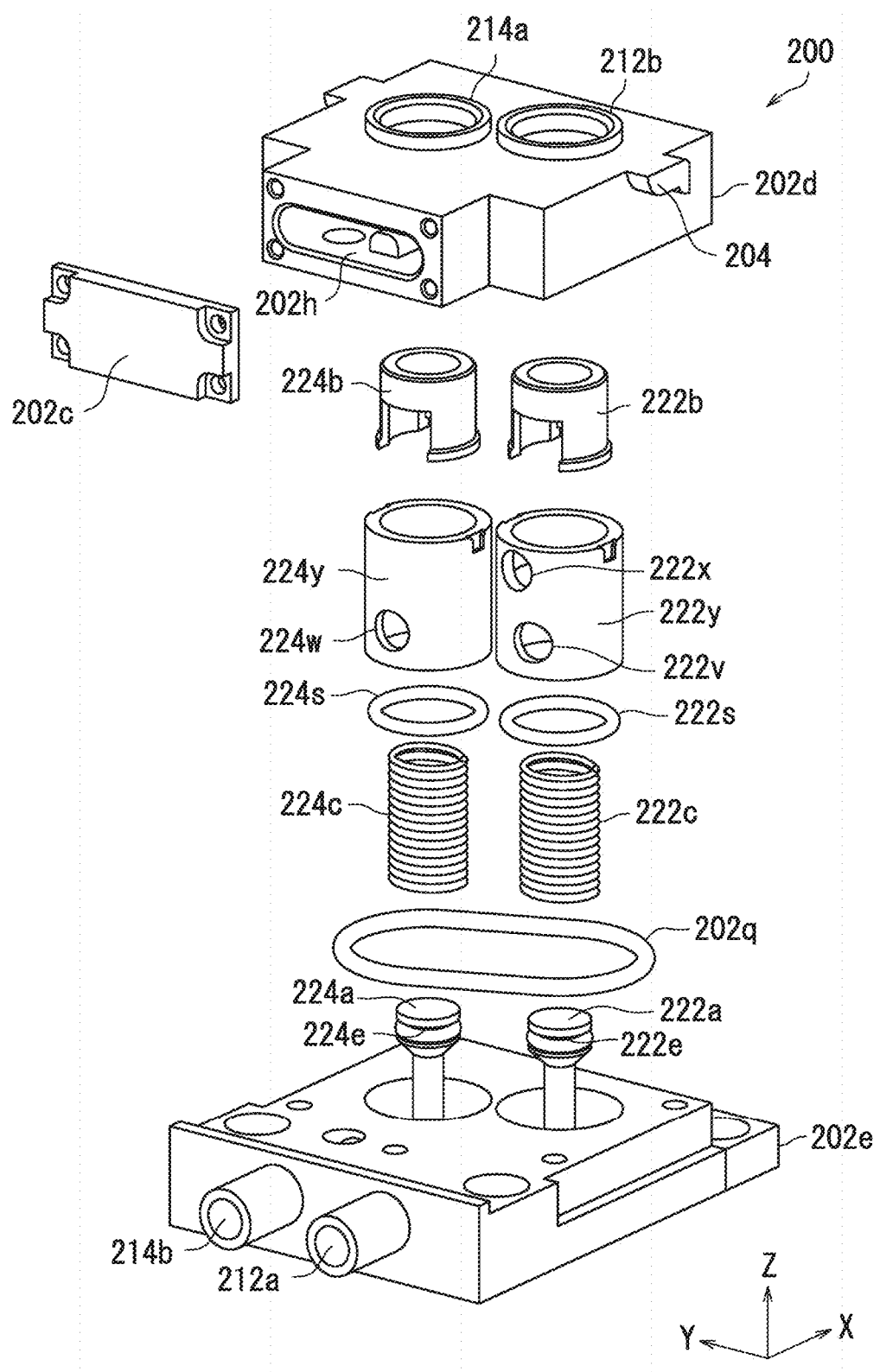
FIG. 13 is a schematic exploded perspective view of a base mechanism in the liquid feeder of the second example embodiment.

Next, the base mechanism 200 in the liquid feeder 100 of the second example embodiment will be described with reference to FIGS. 9 to 13. FIG. 13 is a schematic exploded perspective view of the base mechanism 200 in the liquid feeder of the second example embodiment.

As illustrated in FIG. 13, a first pillar portion 222a and a second pillar portion 224a are fixed to the lower base portion 202e. Specifically, the lower base portion 202e is provided with holes for installing the first base sealing mechanism 222 and the second base sealing mechanism 224. The first pillar portion 222a, the first base pressurizing member 222c, the second pillar portion 224a, and the second base pressurizing member 224c are installed in the corresponding holes of the lower base portion 202e.

A sealing member 202q in an annular shape is disposed on an upper surface of the lower base portion 202e. The upper surface (surface on a side in +Z-direction) of the lower base portion 202e faces a lower surface (surface on a side in −Z-direction) of the upper base portion 202d. Although not illustrated in FIG. 13, a hole corresponding to the sealing member 202q is provided in the lower surface of the upper base portion 202d, and the sealing member 202q is fitted into the hole in the lower surface of the upper base 202d.

The base sealing mechanism 220 includes a first base cylinder 222y and a second base cylinder 224y. The first base cylinder 222y is disposed in the base inflow path 212. The first base cylinder 222y has a tubular shape. The first base cylinder 222y has an inner surface on which a first base valve 222b moves.

The second base cylinder 224y is disposed in the base outflow path 214. The second base cylinder 224y has a tubular shape. The second base cylinder 224y has an inner surface on which a second base valve 224b moves.

The upper base portion 202d is provided with through-holes for installing the first base sealing mechanism 222 and the second base sealing mechanism 224. The first base cylinder 222y and the second base cylinder 224y are inserted into the corresponding through-holes of the upper base portion 202d. A sealing member 222s in an annular shape is attached close to a leading end of the first base cylinder 222y, or the first base communication port 212b. A sealing member 224s in an annular shape is attached close to a leading end of the second base cylinder 224y, or the second base communication port 214a.

The first base cylinder 222y has a bypass communication port 222x and an inflow communication port 222v. The inflow communication port 222v is located on a lower side in Z-axis direction in a side surface of the first base cylinder 222y, and the bypass communication port 222x is located on an upper side in Z-axis direction in the side surface of the first base cylinder 222y. The inflow communication port 222v faces the inflow port 212a, and the base inflow path 212 from the inflow port 212a to the first base communication port 212b is formed through the bypass communication port 222x. The bypass communication port 222x communicates with the communication hole 202h of the upper base portion 202d. As a result, the bypass outflow path 216 is formed through the bypass communication port 222x.

The second base cylinder 224y has an outflow communication port 222w. The outflow communication port 222w is located on a lower side in Z-axis direction in a side surface of the second base cylinder 224y. The outflow communication port 222w faces the outflow port 214b, and the base outflow path 214 from the second base communication port 214a to the outflow port 214b is formed through the outflow communication port 222w.

The first base cylinder 222y is provided with the bypass communication port 222x communicating with the bypass outflow path 216. When the pump mechanism 300 is attached to the base mechanism 200, the bypass communication port 222x is sealed by the first base valve 222b. When the base mechanism 200 is formed into a two-divided structure of the upper base portion 202d and the lower base portion 202e, components for fixing the first pillar portion 222a and the second pillar portion 224a can be reduced in strength. When the first base cylinder 222y and the second base cylinder 224y are used, the upper base portion 202d and the lower base portion 202e can be molded with resin.

The bypass outflow path 216 is formed in the upper base portion 202d and is connected to the outflow port 214b. The bypass outflow path 216 is provided integrally with the base portion, so that another pipe is not required to provide the bypass outflow path 216 or an extra outflow port for connecting to a pipe is not required.

Figure 14:
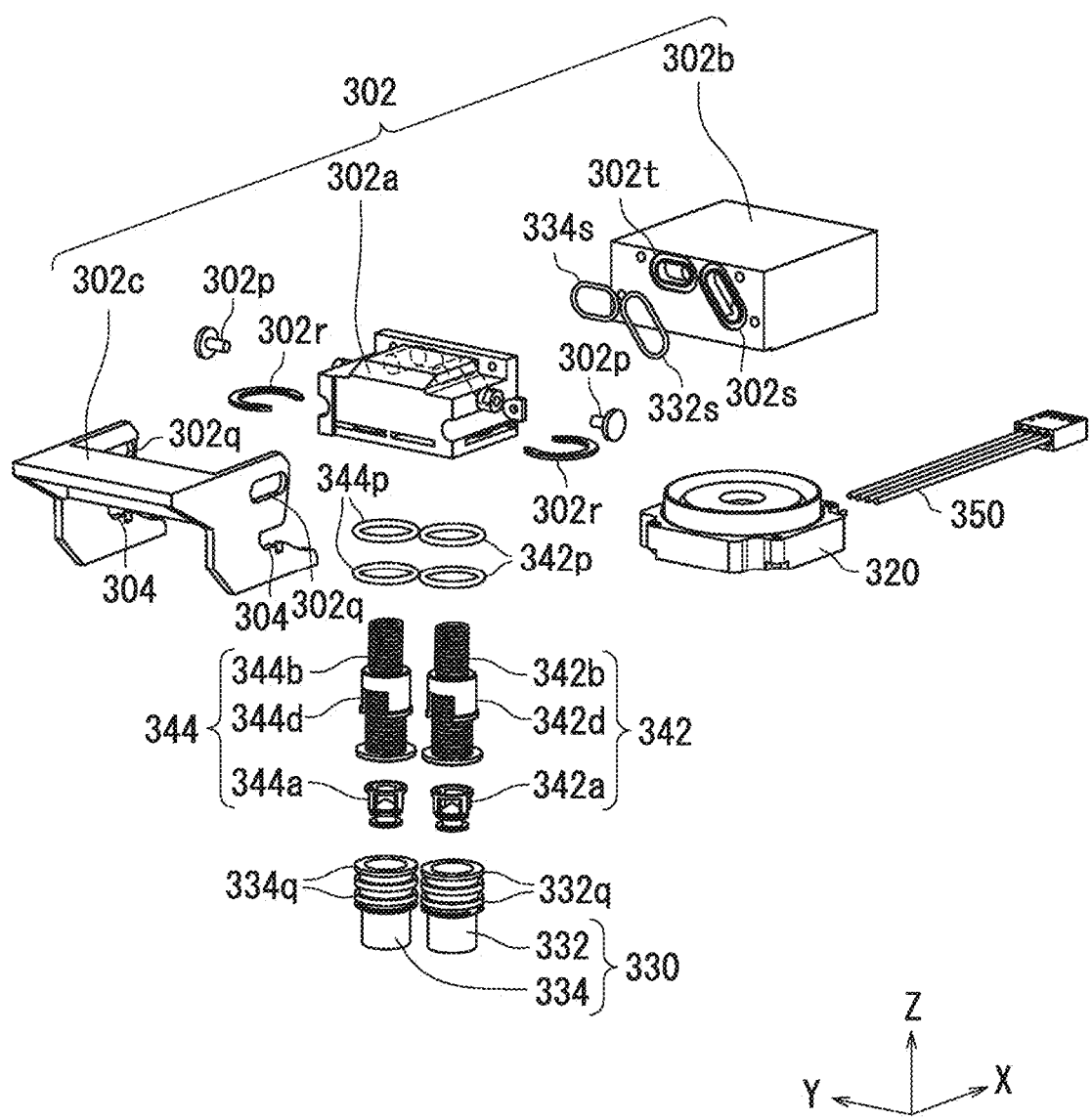
FIG. 14 is a schematic exploded perspective view of a pump mechanism in the liquid feeder of the second example embodiment.

Next, the pump mechanism 300 in the liquid feeder 100 of the second example embodiment will be described with reference to FIG. 14. FIG. 14 is a schematic exploded perspective view of the pump mechanism 300 in the liquid feeder of the second example embodiment.

As illustrated in FIG. 14, the pump mechanism 300 includes the attachment case 302 and the pump device 320. The attachment case 302 includes a first case 302a, a second case 302b, and a fastening plate 302c. The base mechanism 200 is attached to the first case 302a. The pump device 320 is attached to the second case 302b. The first case 302a and the second case 302b face each other, and the first case 302a and the second case 302b are attached to each other.

The second case 302b is provided with a hole 302s in an annular shape and a hole 302t in an annular shape. The holes 302s and 302t are each provided inside with a flow path of liquid. A sealing member 332s in an annular shape is fitted into the hole 302s in an annular shape, and a sealing member 334s in an annular shape is fitted into the hole 302t in an annular shape. The sealing members 332s and 334s are disposed between the first case 302a and the second case 302b to prevent liquid leakage.

The shaft 302p and a fastener 302r are attached to each of side surfaces of the first case 302a on a side in +Y-direction and on a side in −Y-direction.

The fastening plate 302c is attached to the outer side surface of the first case 302a. The shaft 302p is provided on a side surface of the first case 302a, and the fastening plate 302c has a through-hole 302q. The first case 302a is provided with a hole corresponding to the shaft 302p. When the shaft 302p is inserted into the hole of the first case 302a through the through-hole 302q of the fastening plate 302c, the fastening plate 302c can be attached to the first case 302a.

The first pump cylinder 332, the second pump cylinder 334, the first pump sealing mechanism 342, and the second pump sealing mechanism 344 are mounted on a bottom surface of the first case 302a on a side in −Z-direction.

The first pump sealing mechanism 342 includes a first pump valve 342a, a first pump pressurizing member 342b, and a first deformation reducing part 342d. The first pump valve 342a, the first pump pressurizing member 342b, and the first deformation reducing part 342d are disposed in the first pump cylinder 332.

The first pump pressurizing member 342b includes a coil spring. The first deformation reducing part 342d reduces deformation of the first pump pressurizing member 342b. The first deformation reducing part 342d surrounds a central portion of the first pump pressurizing member 342b in its longitudinal direction and reduces deformation of the first pump pressurizing member 342b.

The first pump cylinder 332 is provided at its one end (end on a side in +Z-direction) with a recess 332q in an annular shape, and a sealing member 342p is disposed in the recess 332q.

The second pump sealing mechanism 344 includes a second pump valve 344a, a second pump pressurizing member 344b, and a second deformation reducing part 344d. The second pump valve 344a, the second pump pressurizing member 344b, and the second deformation reducing part 344d are disposed in the second pump cylinder 334.

The second pump pressurizing member 344b includes a coil spring. The second deformation reducing part 344d reduces deformation of the second pump pressurizing member 344b. The second deformation reducing part 344d surrounds a central portion of the second pump pressurizing member 344b in its longitudinal direction and reduces deformation of the second pump pressurizing member 344b.

The second pump cylinder 334 is provided at its one end (end on a side in +Z-direction) with a recess 334q in an annular shape, and a sealing member 344p is disposed in the recess 334q. The pump mechanism 300 has the configuration as described above.

The example embodiments of the present disclosure are described above with reference to the drawings. However, the present disclosure is not limited to the above example embodiments, and can be implemented in various aspects without departing from range of the gist of the present disclosure. Additionally, the plurality of components disclosed in the above example embodiments can be appropriately modified. For example, one component of all components shown in one example embodiment may be added to a component of another example embodiment, or some components of all components shown in one example embodiment may be eliminated from the one example embodiment.

The drawings schematically illustrate each component mainly to facilitate understanding of the disclosure, and thus each illustrated component may be different in thickness, length, number, interval, or the like from actual one for convenience of creating the drawings. The configuration of each component described in the above example embodiments is an example, and is not particularly limited. Thus, it is needless to say that various modifications can be made without substantially departing from range of effects of the present disclosure.

The present disclosure is suitably used for a liquid feeder.

Features of the above-described example embodiments and the modifications thereof may be combined appropriately as long as no conflict arises.

While example embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. A liquid feeder comprising:
a pump; and
a base that is detachable from the pump and through which a liquid flows between the base and the pump when attached to the pump; wherein
the base includes:
   a base flow path portion; and
   a base seal;
the base flow path portion includes:
   an inflow port into which the liquid flows;
   an outflow port from which the liquid flows out;
   a first base communication port that is detachable from the pump and through which the liquid having flowed in from the inflow port flows to the pump at the time of connection to the pump;
   a second base communication port that is detachable from the pump and through which the liquid fed from the pump flows at the time of the connection to the pump;
   a base inflow path that allows the inflow port to communicate with the first base communication port;
   a base outflow path that allows the second base communication port to communicate with the outflow port; and
   a bypass outflow path that is provided in a middle of the base inflow path and communicates with the outflow port;
the base seal includes:
   a first base seal that seals the first base communication port when the pump is removed from the base and opens the first base communication port when the pump is attached to the base; and
   a second base seal that seals the second base communication port when the pump is removed from the base and opens the second base communication port when the pump is attached to the base;
the liquid feeder is configured to switch a flow path of the liquid having flowed in from the inflow port to one of a flow path communicating with the first base communication port and the bypass outflow path;
the liquid feeder is configured to close the bypass outflow path to cause the liquid having flowed in from the inflow port to flow to the pump when the pump is attached to the base; and
the liquid feeder is configured to open the bypass outflow path to cause the liquid having flowed in from the inflow port to flow from the bypass outflow path to the outflow port when the pump is removed from the base; wherein
the first base seal includes:
   a first pillar portion that is in the base inflow path and extends to the first base communication port;
   a first base valve that is located between an inner surface of the base inflow path and the first pillar portion and moves along the base inflow path; and
   a first base pressurizer to pressurize the first base valve toward the first base communication port;
the second base seal includes:
   a second pillar portion that is disposed in the base outflow path and extends to the second base communication port;

a second base valve that is located between an inner surface of the base outflow path and the second pillar portion and moves along the base outflow path; and a second base pressurizer to pressurize the second base valve toward the second base communication port;

when the pump is attached to the base:

the first base valve seals the bypass outflow path and opens a space between the first pillar portion and the first base communication port; and the second base valve opens a space between the second pillar portion and the second base communication port; and when the pump is removed from the base:

the first base valve opens the bypass outflow path and is fitted between the first pillar portion and the first base communication port; and the second base valve is fitted between the second pillar portion and the second base communication port.

2. The liquid feeder according to claim 1, further comprising a lock to lock the pump to the base.

3. The liquid feeder according to claim 1, wherein the base includes:

an upper base portion including the first base communication port and the second base communication port; and a lower base portion including the inflow port and the outflow port and to which the first pillar portion and the second pillar portion are fixed;

the upper base portion and the lower base portion are divided at positions of the base inflow path and the base outflow path;

the base seal includes:

a first base cylinder in a tubular shape that is in the base inflow path;

a second base cylinder in a tubular shape that is in the base outflow path;

the first base valve moves on an inner surface of the first base cylinder;

the second base valve moves on an inner surface of the second base cylinder;

the first base cylinder is provided with a bypass communication port communicating with the bypass outflow path; and when the pump is attached to the base, the first base valve seals the bypass communication port.

4. The liquid feeder according to claim 3, wherein the bypass outflow path is in the upper base portion and is connected to the outflow port.

5. The liquid feeder according to claim 1, wherein the pump includes:

a pump device to circulate the liquid;

a pump flow path portion; and a cylindrical pump cylinder;

the pump cylinder includes:

a first pump cylinder; and a second pump cylinder;

the first pump cylinder is housed in the pump flow path portion, and a portion of the first pump cylinder protrudes from the pump flow path portion to serve as a first pump communication port;

the second pump cylinder is housed in the pump flow path portion, and a portion of the second pump cylinder protrudes from the pump flow path portion to serve as a second pump communication port;

the pump flow path portion includes:

a pump inflow path that allows the first pump cylinder to communicate with the pump device; and a pump outflow path that allows the pump device to communicate with the second pump cylinder;

when the pump is attached to the base:

the first pump cylinder presses the first base valve in a direction away from the first base communication port to seal the bypass outflow path; and the second pump cylinder presses the second base valve in a direction away from the second base communication port.

6. The liquid feeder according to claim 5, wherein the pump includes:

a first pump seal that seals the first pump communication port when the pump is removed from the base; and a second pump seal that seals the second pump communication port when the pump is removed from the base;

the first pump seal includes:

a first pump valve to move along the first pump cylinder and is fitted into the first pump cylinder; and a first pump pressurizer to pressurize the first pump valve toward the first pump communication port; and the second pump seal includes:

a second pump valve to move along the second pump cylinder and is fitted into the second pump cylinder; and a second pump pressurizer to pressurize the second pump valve toward the second pump communication port.

* * * * *